(12) United States Patent
Oyu et al.

(10) Patent No.: US 8,531,010 B2
(45) Date of Patent: Sep. 10, 2013

(54) SEMICONDUCTOR DEVICE INCLUDING A PILLAR MOS TRANSISTOR

(75) Inventors: Kiyonori Oyu, Tokyo (JP); Kazuhiro Nojima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 319 days.

(21) Appl. No.: 12/938,767

(22) Filed: Nov. 3, 2010

(65) Prior Publication Data

US 2011/0266615 A1 Nov. 3, 2011

(30) Foreign Application Priority Data

Nov. 10, 2009 (JP) ................. 2009-257152

(51) Int. Cl.
*H01L 21/70* (2006.01)
(52) U.S. Cl.
USPC .... 257/627; 257/329; 257/347; 257/E21.633; 257/E29.004; 257/E29.262; 438/198
(58) Field of Classification Search
USPC .......... 257/329, 367, E21.633, 627, E29.004, 257/E29.262; 438/198
See application file for complete search history.

(56) References Cited

U.S. PATENT DOCUMENTS

| | | | | |
|---|---|---|---|---|
| 7,906,830 B2* | 3/2011 | Wells et al. | ................... | 257/521 |
| 2002/0063292 A1* | 5/2002 | Armstrong et al. | ........... | 257/367 |
| 2002/0154556 A1* | 10/2002 | Endoh et al. | .................. | 365/200 |
| 2002/0197868 A1* | 12/2002 | Endoh et al. | .................. | 438/689 |
| 2006/0154426 A1* | 7/2006 | Anderson et al. | ............ | 438/300 |
| 2009/0065856 A1* | 3/2009 | Oyu et al. | .................... | 257/329 |

FOREIGN PATENT DOCUMENTS

| | | |
|---|---|---|
| JP | 2008-288391 | 11/2008 |
| JP | 2009-010366 | 1/2009 |
| JP | 2009-081389 | 4/2009 |

* cited by examiner

*Primary Examiner* — John C Ingham

(74) *Attorney, Agent, or Firm* — Young & Thompson

(57) ABSTRACT

A semiconductor structure may include, but is not limited to: a semiconductor substrate; a first semiconductor structure extending upwardly over the semiconductor substrate; and a second semiconductor structure extending upwardly over the semiconductor substrate, the first and second semiconductor structures being aligned in a first <100> direction.

19 Claims, 15 Drawing Sheets

SEMICONDUCTOR DEVICE INCLUDING A PILLAR MOS TRANSISTOR

BACKGROUND OF THE INVENTION

1. Field of the Invention

The present invention relates to a semiconductor device including a pillar MOS transistor and a method of manufacturing the same.

Priority is claimed on Japanese Patent Application No. 2009-257152, filed Nov. 10, 2009, the content of which is incorporated herein by reference.

2. Description of the Related Art

Regarding pillar MOS transistors (vertical MOS transistors), a gate electrode covers a side surface of a pillar, and a diffusion layer, which is a source and/or drain, is formed in a top portion of the pillar. For this reason, it is difficult to connect the gate electrode to a wire in an upper layer. To solve the problem, Japanese Patent Laid-Open Publication No. 2008-288391, No. 2009-10366, and No. 2009-81389 disclose semiconductor devices including not only a transistor pillar including a gate electrode, but also a dummy pillar adjacent to the transistor pillar. A dummy gate electrode, which covers a side surface of the dummy pillar, is formed so as to be connected to the gate electrode of the transistor pillar. The dummy gate electrode is connected to a wire in an upper layer via a gate contact. Thus, a voltage is supplied to the gate electrode of the transistor pillar via the dummy gate electrode.

FIG. 13 is a plan view illustrating an arrangement of a transistor pillar 1 and a dummy pillar 2 of the related art, which is viewed from a direction perpendicular to a main surface of a substrate. Regarding a silicon mono-crystalline substrate used for manufacturing a semiconductor device, a notch portion, which indicates a crystal face orientation, is formed in a (110) plane. A <110> direction is perpendicular to the (110) plane. A general semiconductor circuit is laid out on a substrate surface based on two equivalent orthogonal <110> directions. For this reason, the transistor pillar 1 and the dummy pillar 2 are aligned in the <110> direction, as shown in FIG. 13.

FIGS. 14 to 19 are cross-sectional views indicative of a process flow illustrating a method of manufacturing a pillar MOS transistor of the related art. Firstly, an insulating film 3 is formed on a main surface of a silicon substrate 4. Then, the insulating film 3 is patterned to form insulating films 3A and 3B that are bases for forming the transistor pillar 1 and the dummy pillar 2. Then, the transistor pillar 1 and the dummy pillar 2 are simultaneously formed using the patterned insulating films 3A and 3B as masks, as shown in FIG. 14. The transistor pillar 1 and the dummy pillar 2 are circular in plan view. At this stage, an orientation of the transistor pillar 1 and the dummy pillar 2 is not considered. Consequently, the transistor pillar 1 and the dummy pillar 2 are aligned in the <110> direction, as shown in FIG. 13.

Then, the exposed side surfaces of the transistor pillar 1 and the dummy pillar 2 and the exposed main surface of the silicon substrate 4 are cleansed. Then, a thermal oxide film 6 is formed so as to cover the exposed side surfaces of the transistor pillar 1 and the dummy pillar 2 and the exposed main surface of the silicon substrate 4. Then, a dopant is introduced into near-surface regions of the silicon substrate 4 which are adjacent to bottom portions of the transistor pillar 1 and the dummy pillar 2, so as to form lower diffusion layers 5, as shown in FIG. 15.

Then, portions of the thermal oxide film 6, which cover the side surfaces of the transistor pillar 1 and the dummy pillar 2, are removed using a chemical solution. Then, a gate insulating film 7 is formed by thermal oxidization so as to cover side surfaces of the transistor pillar 1 and the dummy pillar 2, as shown in FIG. 16.

Then, gate electrodes 8A and 8B are formed so as to cover the side surfaces of the transistor pillar 1 and the dummy pillar 2 through the gate insulating films 7, respectively, as shown in FIG. 17. In this case, a thickness of each of the gate electrode 8A and 8B is set to a value that is larger than half of the distance between the transistor pillar 1 and the dummy pillar 2 so that the gate electrodes 8A and 8B contact each other.

Then, an inter-layer insulating film 10 is formed so as to cover the insulating films 3A and 3B covering the upper surfaces of the transistor pillar 1 and the dummy pillar 2. Then, a portion of the inter-layer insulating film 10, which covers an upper surface of the insulating film 3A, is removed. Then, the insulating film 3A on the transistor pillar 1 is removed so as to expose the upper surface of the transistor pillar 1. Thus, a hole is formed in the inter-layer insulating film 10. Then, an insulating film 10A is formed so as to cover a side surface of the hole. Then, an upper diffusion layer 9 is formed in a top portion of the transistor pillar 1, as shown in FIG. 18.

Then, an inter-layer insulating film 10C is formed over the inter-layer insulating film 10A. Then, first to third contact holes are formed so as to partially expose the lower diffusion layer 5, the upper diffusion layer 9, and the gate electrode 8A, respectively. Then, first to third contacts 11 to 13 (the first contact 11 is not shown) filling the first to third contact holes are formed, as shown in FIG. 19. Then, wires (not shown) are formed so as to be connected to the first to third contacts 11 to 13.

As explained above, the above method includes the thermal oxidization process, the etching process, and the cleaning process. A thermal oxidation rate and an etching rate of silicon depend on a crystal face orientation. For example, a thermal oxidation rate and an etching rate of the (110) plane are greater than those of the (100) plane. Since the transistor pillar 1 and the dummy pillar 2 are formed by etching the silicon substrate 4, both a Si (110) plane and a Si (100) plane are included in each of the side surfaces of the transistor pillar 1 and the dummy pillar 2.

For this reason, the thermal oxide film 6 covering the (110) plane of the pillar side surface is thicker than the thermal oxide film 6 covering the (100) plane of the pillar side surface. Since the thermal oxide film 6 is removed by a chemical solution, the <110>-directed pillar diameter becomes smaller than the <100>-directed pillar diameter.

Further, if the thermal oxide film 6 is removed by a chemical solution, a larger area of the (110) plane is subjected to the chemical solution than the (100) plane. Accordingly, the <110>-directed pillar diameter becomes further smaller than the <100>-directed pillar diameter.

In this manner, if the thermal oxidation process, the etching process, and the like are repeated, the (110) plane is removed faster than the (100) plane. The <110>-directed pillar diameter is reduced by approximately 15 nm from the original pillar diameter when the pillar is formed. Additionally, the pillar shape is a circle in plane view before the thermal oxidation process, the etching process, and the like are carried out. After these processes, the pillar shape changes to substantially a rectangle in plan view, as shown in FIG. 20. The (110) plane of the transistor pillar 1 and the (110) plane of the dummy pillar 2 face each other. As explained above, the thermal oxidation rate and the etching rate of the (110) plane is greater than those of the (100) plane. For this reason, a speed at which the distance between the transistor pillar 1 and the dummy pillar 2 (the minimum distance between side surfaces of the pillars 1 and 2) increases is faster when the two (110) planes face each other than when the two (100) planes face each other and when the (100) plane faces the (110) plane. Specifically, the distance between the pillars 1 and 2 increases at double a speed at which the (110) plane is removed in a direction perpendicular to the (110) plane.

For example, when pillars are formed with the feature size of 50 nm (diameter and pitch), the <110>-directed pillar diameter and interval after a pillar MOS transistor is complete are 35 nm and 65 nm, respectively. For this reason, to make the gate electrode 8A of the transistor pillar 1 contact the gate electrode 8B of the dummy pillar 2, a thickness of the gate electrode has to be set to 33 nm or more. In consideration of a variation in pillar diameter and the like, a thickness of the gate electrode 8 has to be set to approximately 45 nm or more.

If the gate electrodes 8A and 8B are thicker, a greater stress acts on silicon portions of the transistor pillar 1 and the dummy pillar 2, thereby causing an increase in a junction leakage current of the upper diffusion layer 9, a variation in threshold voltage, and the like. Particularly when the gate electrodes 8A and 8B are made of a metal, the effects of the increase in a junction leakage current, the variation in threshold voltage, and the like become greater. For this reason, it is necessary to make the gate electrodes 8A and 8B thinner. However, the above pillar MOS transistor of the related art cannot achieve thinner gate electrodes 8A and 8B.

SUMMARY

In one embodiment, a semiconductor structure may include, but is not limited to: a semiconductor substrate; a first semiconductor structure extending upwardly over the semiconductor substrate; and a second semiconductor structure extending upwardly over the semiconductor substrate, the first and second semiconductor structures being aligned in a first <100> direction.

In another embodiment, a semiconductor device may include, but is not limited to: a semiconductor substrate; a first semiconductor structure extending upwardly over the semiconductor substrate; and a second semiconductor structure extending upwardly over the semiconductor substrate. The second semiconductor structure comprises first to third portions. The first portion is the nearest to the first semiconductor structure. The first portion and the first semiconductor structures are aligned in a first <100> direction. The second portion extends horizontally from the first portion to the third portion in a second <100> direction perpendicular to the first <100> direction.

In still another embodiment, a semiconductor device may include, but is not limited to: a semiconductor substrate; a first semiconductor structure extending upwardly over the semiconductor substrate; a second semiconductor structure extending upwardly over the semiconductor substrate; and a third semiconductor structure extending upwardly over the semiconductor substrate. The first and second semiconductor structures are aligned in a first <110> direction. The third semiconductor structure comprises first to third portions. The first and second semiconductor structures are equally separated from the first portion. The first portion and the first semiconductor structure are aligned in a first <100> direction. The first portion and the second semiconductor structure are aligned in a second <100> direction perpendicular to the first <100> direction. The second portion horizontally extends from the first portion to the third portion in a second <110> direction perpendicular to the first <110> direction.

BRIEF DESCRIPTION OF THE DRAWINGS

The above features and advantages of the present invention will be more apparent from the following description of certain preferred embodiments taken in conjunction with the accompanying drawings, in which:

FIGS. 3A to 9A are plan views indicative of a process flow illustrating a method of manufacturing the semiconductor device of the first embodiment;

FIGS. 3B to 9B are cross-sectional views taken along line A-A' shown in FIGS. 3A to 9A;

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
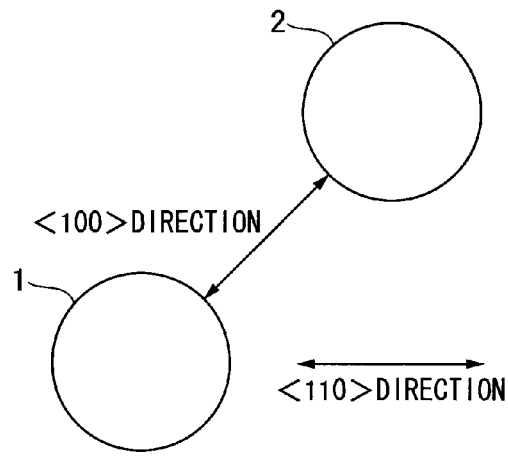
FIG. 1 is a plan view illustrating an arrangement of a transistor pillar and a dummy pillar which are included in a semiconductor device according to a first embodiment of the present invention.

FIG. 1 is a plan view illustrating an arrangement of a transistor pillar 1 and a dummy pillar 2 adjacent to the transistor pillar 1, which is viewed in a direction perpendicular to a main surface of a silicon substrate. Like reference numerals denote like elements between the first embodiment and the related art shown in FIGS. 13-20.

The transistor pillar 1 and the dummy pillar 2 adjacent to the transistor pillar 1 are aligned in the <100> direction. The thermal oxidation rate and the etching rate of the (110) plane are the largest among planes forming the transistor pillar 1 and the dummy pillar 2. In other words, the thermal oxidation rate and the etching rate of the (110) plane is larger than those of the (100) plane.

The <100> direction is at 45-degrees to the (110) plane. When the pillar MOS transistors 1 and 2 are formed, the transistor pillar 1 and the dummy pillar 2 are substantially circle in plan view. During the thermal oxidation process, the etching process, and the cleaning process, the (110) plane is preferentially-removed among side surfaces of the transistor pillar 1 and the dummy pillar 2. Consequently, the shapes of the transistor pillar 1 and the dummy pillar 2 change to a substantially rectangle in plan view, which is formed by four equivalent (110) planes.

The <100> direction is a direction in which corners of two adjacent equivalent (110) planes of the transistor pillar 1 and the dummy pillar 2 are aligned. The distance between the two adjacent corners of the transistor pillars 1 and the dummy pillar 2 defines a distance between the transistor pillar 1 and the dummy pillar 2. The removed amount of the corner portion is the smallest among side surfaces of the pillars 1 and 2. Therefore, the arrangement of the transistor pillar 1 and the dummy pillar 2 shown in FIG. 1 achieves the smallest variation in distance between the transistor pillar 1 and the dummy pillar 2 during a thermal oxidation process, an etching process, and the like.

A variation in pillar diameter of a semiconductor device according to a first embodiment of the present invention is smaller than that of the related art in which the transistor pillar 1 and the dummy pillar 2 are aligned in the <110> direction. For this reason, a thinner gate electrode can be used to reliably make a gate electrode and a dummy gate electrode contact each other, thereby preventing an increase in a thickness of the gate electrode and preventing a variation in characteristics due to stress acting on the gate electrode.

While the pillar shape changes from a circle to a rectangle in plan view, the pillar shape becomes an octagon in plan view formed by four equivalent (110) planes and four equivalent (100) planes each of which is between two adjacent (110) planes. In this case, the distance between the transistor pillar 1 and the dummy pillar 2 becomes a distance between two (100) planes facing each other in the <100> direction.

Figure 2A:
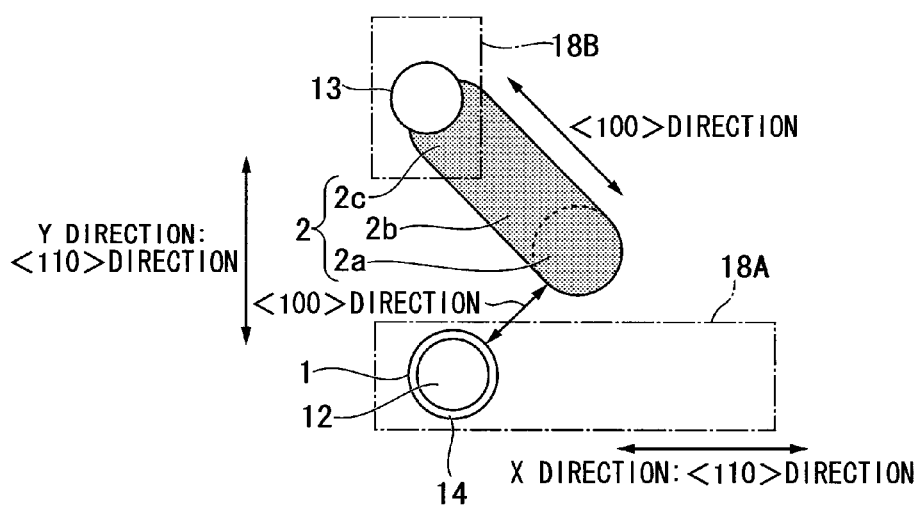
FIGS. 2A and 2B are plane views illustrating layouts of the transistor pillar, the dummy pillar, and wires.
Figure 2B:
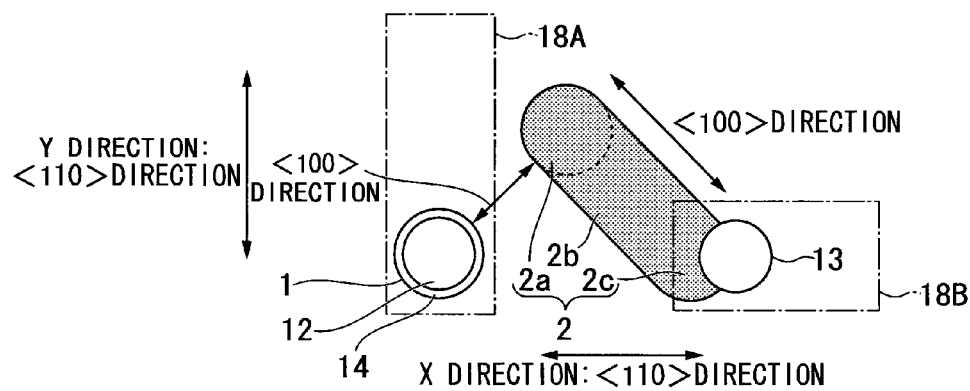

FIGS. 2A and 2B illustrate two examples of arrangements of the transistor pillar 1 and the dummy pillar 2 of the first embodiment. The transistor pillar 1 and an extending source portion 2a of the dummy pillar 2 are aligned in the <100> direction. A bit line 18A is connected to the contact 12 leading to the upper diffusion layer 9. A word line 18B is connected to the contact 13 leading to the dummy gate electrode 8B.

The dummy pillar 2 includes the extending source portion 2a, an extending portion 2b, and an extending end portion 2c. The extending portion 2b extends in a direction away from the transistor pillar 1. The contact 13 is connected to a top portion 8Bb of the dummy gate electrode 8B, the top portion 8Bb being positioned at the extending end portion 2c in plan view. The contact 13 upwardly extends from the top portion 8Bb in a direction perpendicular to the main surface of the substrate. The contact 12 upwardly extends from the upper diffusion layer 9 in the direction perpendicular to the main surface of the substrate.

Thus, the dummy pillar 2 extends in a desired direction in plan view, thereby increasing the flexibility of wire directions. In other words, the gate contact 1 can be formed at the extending end portion 2c of the dummy pillar 2 in plan view so as to be connected to the top portion 8Bb of the dummy gate electrode 8B. Therefore, a wire can be lead out from the extending end portion 2c of the dummy portion 2.

In the case of the layout shown in FIG. 2A, the transistor pillar 1 and the extending source portion 2a of the dummy pillar 2 are aligned in a first <100> direction. The extending portion 2b of the dummy pillar 2 extends in a second <100> direction perpendicular to the first <100> direction. The extending end portion 2c of the dummy pillar 2 and the contact 12 are aligned in a first <110> direction parallel to the Y direction. The bit line 18A, which is connected to the contact 12, extends in a second <110> direction parallel to the X direction. The word line 18B, which is connected to the contact 13, extends in the first <110> direction that is parallel to the Y direction and away from the bit line 18A.

In the case of the layout shown in FIG. 2B, the transistor pillar 1 and the extending source portion 2a of the dummy pillar 2 are aligned in the first <100> direction similarly to FIG. 2A. The extending portion 2b of the dummy pillar 2 extends in the second <100> direction perpendicular to the first <100> direction. However, the second <100> direction shown in FIG. 2B faces opposite to the second <100> direction shown in FIG. 2A. The extending end portion 2c and the contact 12 are aligned in the second <110> direction parallel to the X direction. The bit line 18A, which is connected to the contact 12, extends in the first <110> direction parallel to the Y direction. The word line 18B, which is connected to the contact 13, extends in the second <110> direction that is parallel to the X direction and away from the bit line 18A.

Hereinafter, a method of manufacturing a semiconductor device according to the first embodiment is explained with reference to FIGS. 3A to 9B. As an example of the method of the first embodiment, a method of manufacturing a pillar MOS transistor is explained here. FIGS. 3A to 9A are plan views illustrating a process flow indicating the method of the first embodiment, specifically arrangements of main elements. FIGS. 3B to 9B are cross-sectional views taken along line A-B shown in FIGS. 3A to 9A.

Figure 3A:
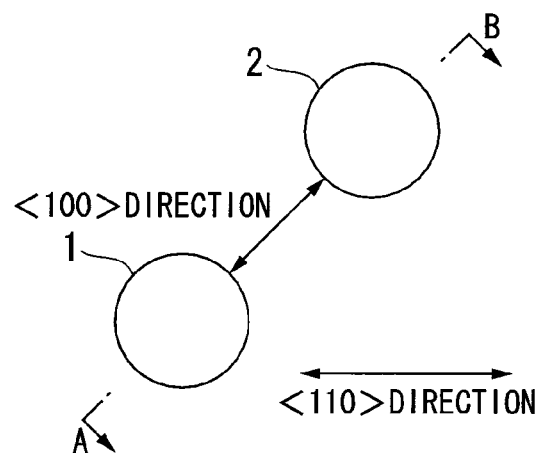
Figure 3B:
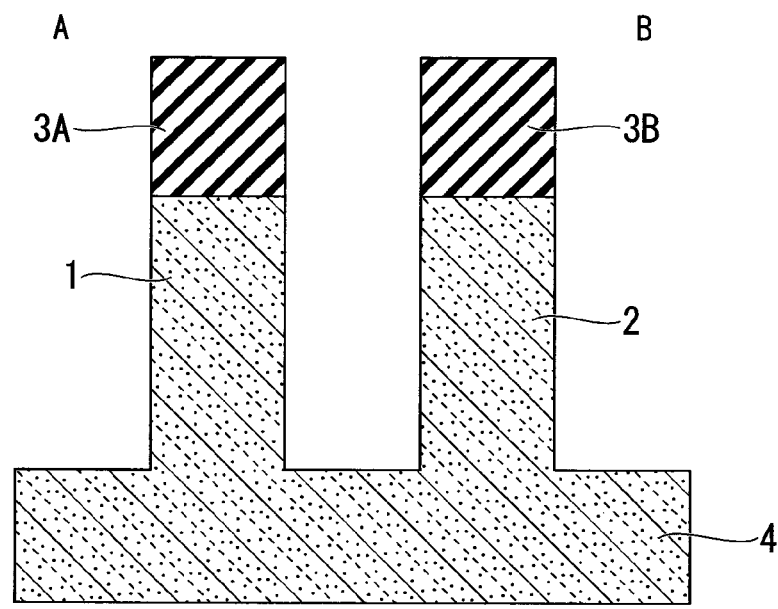

In a first process shown in FIGS. 3A and 3B, the transistor pillar 1 and the dummy pillar 2 are formed using the insulating films 3A and 3B as masks so that the transistor pillar 1 and the extending source portion 2a of the dummy pillar 2 are aligned in the <100> direction in plan view.

Specifically, the insulating film 3 is formed over a main surface of the silicon substrate 4. The insulating film 3 may be a single-layered film or a multi-layered film. For example, a multi-layered film, which includes a silicon oxide film as a protection insulating film and a silicon nitride film as a hard mask, may be used. In this case, the silicon oxide film and the silicon nitride film can be formed by a CVD (Chemical Vapor Deposition) method and the like.

Then, the insulating film 3 is patterned to form insulating films 3A and 3B that are circular in plan view, as shown in FIG. 3A. The insulating films 3A and 3B are bases for forming the transistor pillar 1 and the dummy pillar 2. Then, the silicon substrate 4 is dry-etched using the insulating films 3A and 3B as masks. Remaining portions of the silicon substrate 4, which are covered by the insulating films 3A and 3B, form the transistor pillar 1 and the dummy pillar 2. Thus, the transistor pillar 1 and the dummy pillar 2, which upwardly extend in a direction perpendicular to the main surface of the substrate 4, are formed.

In this case, a silicon nitride film having a thickness of, for example, 100 nm is used as the insulating film 3. The diameters of the transistor pillar 1 and the dummy pillar 2 are, for example, 50 nm. The distance between the transistor pillar 1 and the dummy pillar 2 is, for example, 50 nm. The heights of the transistor pillar 1 and the dummy pillar 2 are, for example, 125 nm.

In the first process, multiple transistor pillars 1 and dummy transistors 2, which extend upwardly in a direction perpendicular to the main surface of the silicon substrate 4, can be formed. Top surfaces of the transistor pillar 1 and the dummy pillar 2 are covered by the insulating films 3A and 3B, respectively. Preferably, the transistors 1 and the dummy pillars 2 are simultaneously formed for simplification of the first process.

In the first process, the dummy pillar 2 may have the extending portion 2b that extends, in plan view, from the extending source portion 2a in a direction away from the transistor pillar 1. Specifically, the extending portion 2b can be formed by patterning the insulating film 3 so as to have a desired shape of the dummy pillar 2 including the extending portion 2b.

Figure 4A:
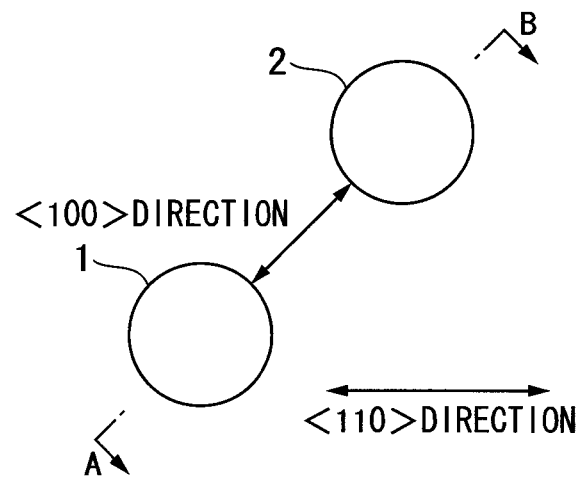
Figure 4B:
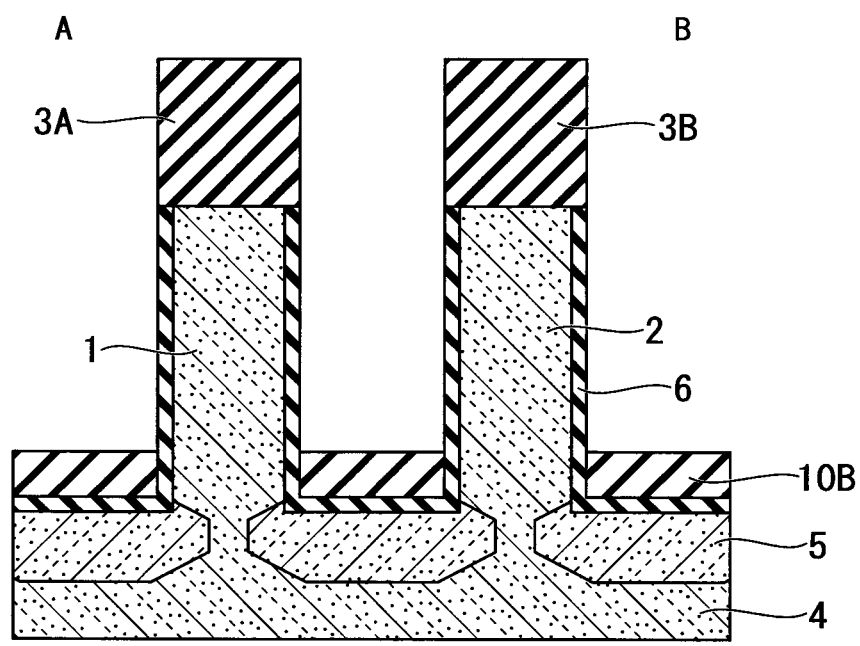

In a second process shown in FIGS. 4A and 4B, the thermal oxide film 6, which covers side surfaces of the transistor pillar 1 and the dummy pillar 2, is formed. Then, a dopant is introduced into a near-surface region of the silicon substrate 4 which is adjacent to a bottom portion of the transistor pillar 1, so as to form the lower diffusion layers 5.

Specifically, exposed side surfaces of the transistor pillar 1 and the dummy pillar 2 and the exposed main surface (active region) of the silicon substrate 4 around the transistor pillar 1 and the dummy pillar 2 are cleansed. Then, the thermal oxide film 6 is formed by thermal oxidation so as to cover the exposed side surfaces of the pillars 1 and 2 and the exposed main surface of the silicon substrate 4. A thickness of the thermal oxide film 6 is, for example, 5 nm.

Then, an impurity, which has a conductive type opposite to the conductive type of the impurity contained in the silicon substrate 4, is ion-implanted into the active region of the silicon substrate 4 to form the lower diffusion layers 5 adjacent to the transistor pillar 1 and the dummy pillar 2. For example, the ion-implantation is carried out at an energy of 10 keV, at a dose of $1\times10^{14}/cm^2$. Then, a thermal treatment process is carried out at a temperature of 900° C. for approximately 10 seconds.

After the thermal treatment process, an insulating film 10B, which has a thickness of, for example, 20 nm, may be formed over the lower diffusion layers 5, as shown in FIG. 4B. The insulating film 10B can be formed by, for example, an HDP (High Density Plasma) method.

Figure 5A:
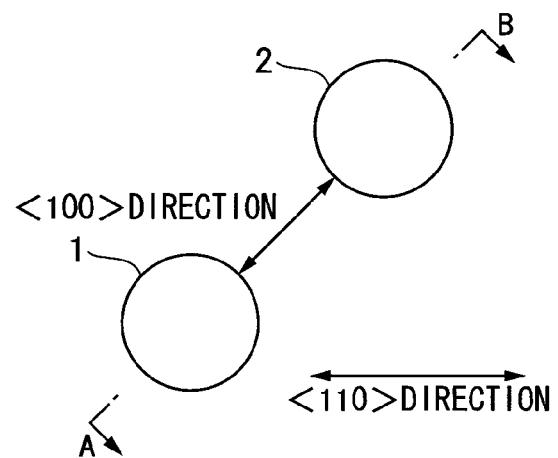
Figure 5B:
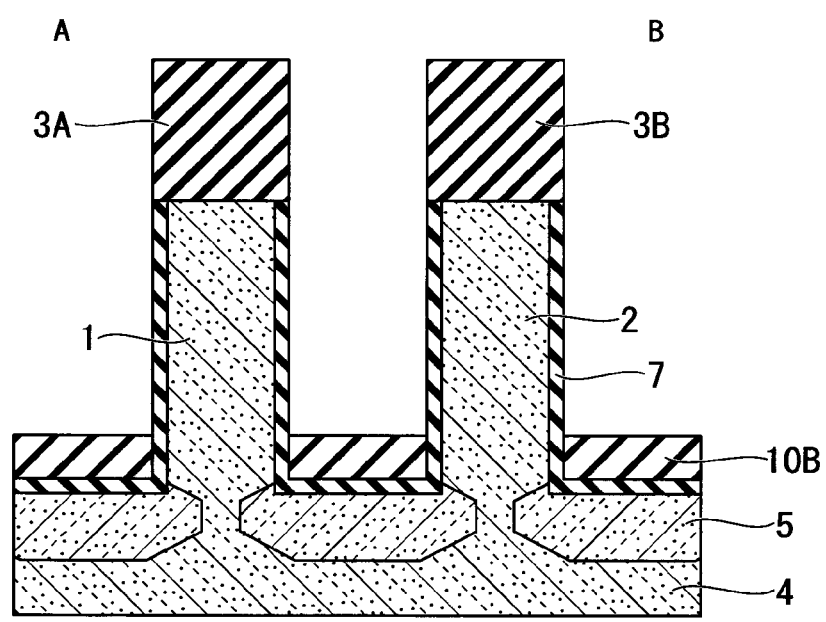

In a third process shown in FIGS. 5A and 5B, portions of the thermal oxide film 6, which cover the side surfaces of the transistor pillar 1 and the dummy pillar 2, are removed by a chemical solution. Then, the gate insulating films 7, which cover the side surfaces of the transistor pillar 1 and the dummy pillar 2, are formed.

Specifically, the portions of the thermal oxide film 6, which cover the side surfaces of the transistor pillar 1 and the dummy pillar 2, are removed by a wet etching process using a fluorine containing solution (for example, commercial LAL 30). In this case, the thermal oxide film 6 is wet-etched by 10 nm. Thus, the side surfaces of the transistor pillar 1 and the dummy pillar 2 are exposed.

Then, the gate insulating films 7 are formed by thermal oxidation or the like so as to cover the exposed side surfaces of the transistor pillar 1 and the dummy pillar 2. Preferably, the gate insulating film 7 covering the side surface of the transistor pillar 1 and the gate insulating film 7 covering the side surface of the dummy pillar 2 are simultaneously formed for simplification of the third process. A thickness of the gate insulating film 7 is, for example, 2.5 nm.

Although not shown in FIGS. 5A and 5B, the <100>-directed diameters of the transistor pillar 1 and the dummy pillar 2 are reduced by approximately 8 nm from the original diameters of 50 nm when the pillars 1 and 2 are formed. The <110>-directed diameters of the transistor pillar 1 and the dummy pillar 2 are reduced by approximately 15 nm.

Figure 6A:
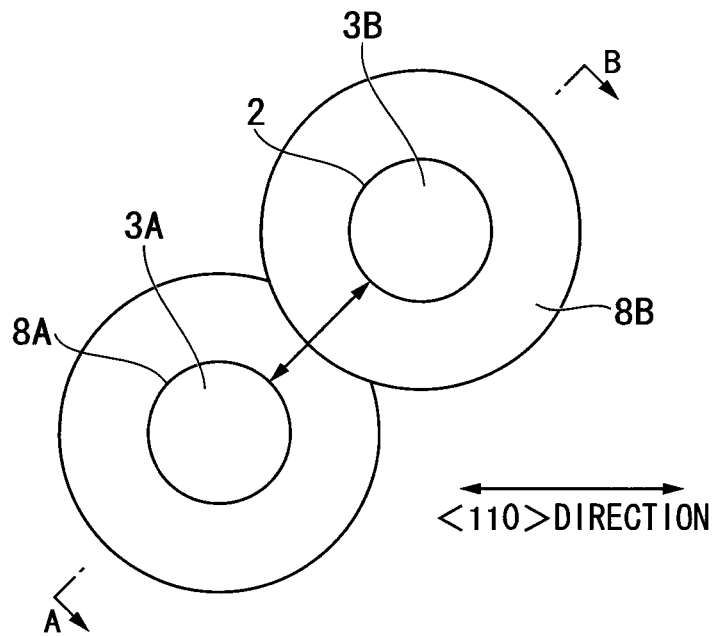
Figure 6B:
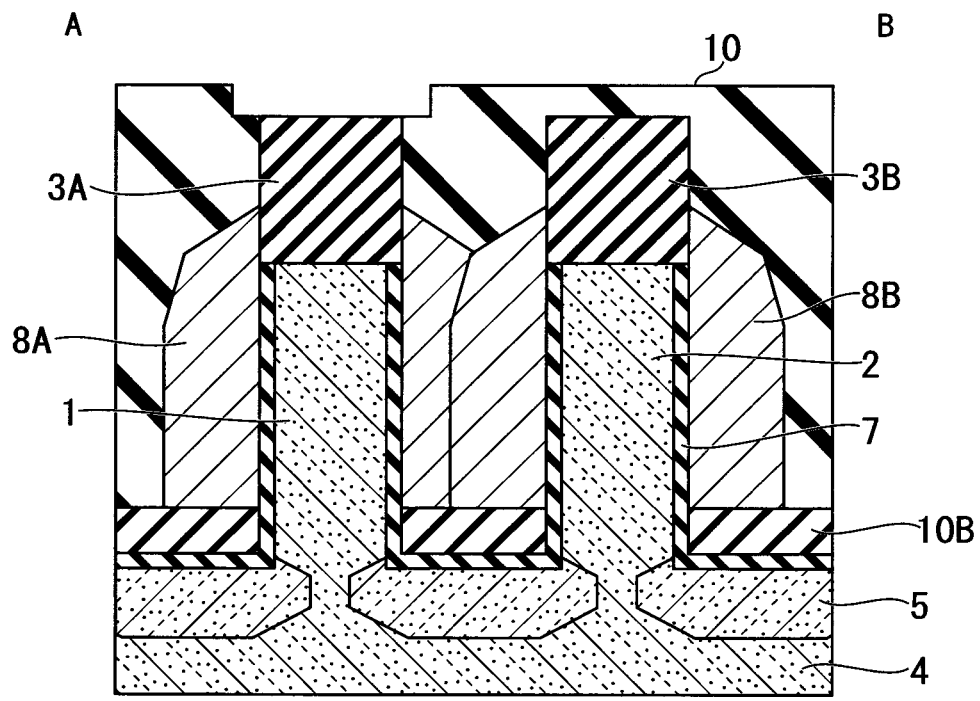

In the fourth process shown in FIGS. 6A and 6B, the gate electrodes 8A and 8B are formed so as to cover the side surfaces of the transistor pillar 1 and the dummy pillar 2 through the gate insulating film 7, respectively. Then, the inter-layer insulting film 10 is formed so as to cover the insulating films 3A and 3B. Then, a portion of the inter-layer insulating film 10, which covers an upper surface of the insulating film 3A, is removed to expose the upper surface the insulating film 3A.

Specifically, the side surface of the gate insulating film 7 is subjected to an ammonia atmosphere such that a nitrogen concentration at the side surface of the gate insulating film 7 is 15%. Thus, the side surface of the gate insulating film 7 is nitrided.

Then, a titanium nitride film is formed by the CVD method so as to cover the side surfaces of the transistor pillar 1 and the dummy pillar 2 and the upper surface of the insulating film 10B. A thickness of the titanium film is, for example, 10 nm. Then, a tungsten film, which covers the titanium nitride film, is formed by the CVD method. A thickness of the tungsten film is, for example, 25 nm.

Then, an etching process is carried out so that only portions of the tungsten film and the titanium nitride film, which cover the side surfaces of the transistor pillar 1 and the dummy pillar 2, remain. Thus, the gate electrode 8A covering the side surface of the transistor pillar 1 and the gate electrode 8B covering the side surface of the dummy pillar 2 can be formed. In this case, the gate electrodes 8A and 8B of the first embodiment are made of the tungsten film and the tungsten nitride film. Preferably, the gate electrodes 8A and 8B are simultaneously formed for simplification of the fourth process. Further, thicknesses of the gate electrodes 8A and 8B are adjusted so that the gate electrode 8A contacts the gate electrode 8B, as shown in FIG. 6B.

Then, the inter-layer insulating film 10 is formed so as to cover the insulating films 3A and 3B covering the upper surfaces of the transistor pillar 1 and the dummy pillar 2. Then, a portion of the inter-layer insulating film 10, which covers only the upper surface of the insulating film 3A, is removed to expose the insulating film 3A covering the upper surface of the transistor pillar 1.

Figure 7A:
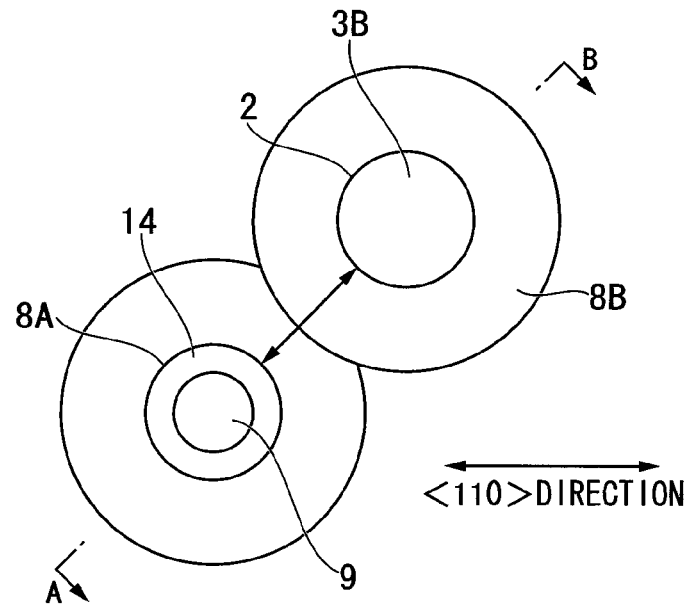
Figure 7B:
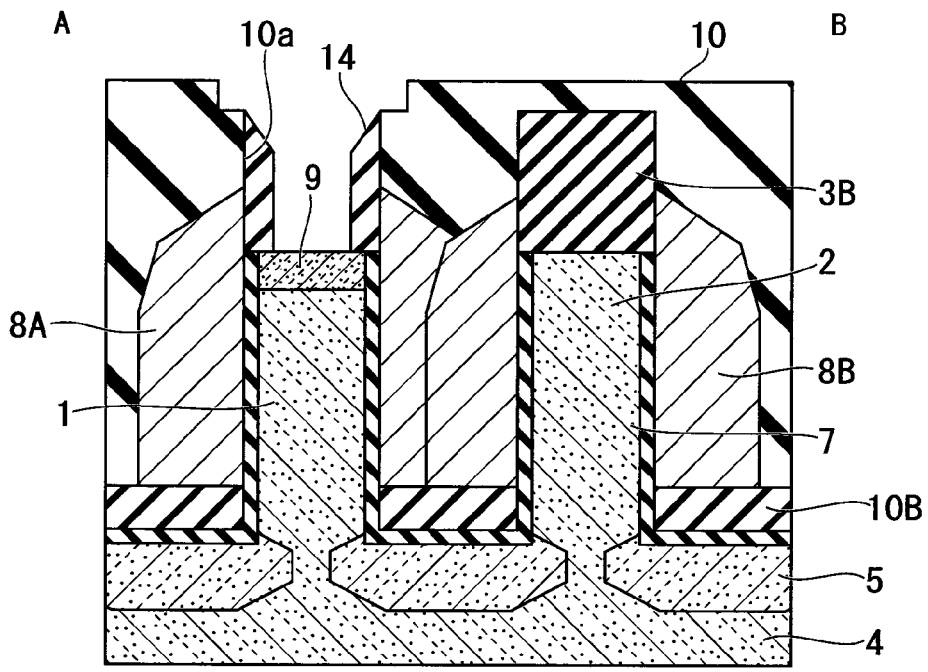

In a fifth process shown in FIGS. 7A and 7B, the insulating film 3A on the transistor pillar 1 is removed. Thus, a first hole 10a is formed. Then, an insulating film 14 is formed so as to cover an inner surface of the first hole 10a. Then, the upper diffusion layer 9 is formed in a top portion of the transistor pillar 1.

Specifically, a silicon oxide film is formed over the entire surface of the inter-layer insulating film 10. Then, the silicon oxide film is patterned so that only a portion of the silicon nitride film which covers the upper surface of the transistor pillar 1 is exposed, and a portion of the silicon oxide film which covers the upper surface of the dummy pillar 2 is protected. Then, the exposed insulating film 3A covering the transistor pillar 1 is removed by a dry etching process or a wet etching process. Thus, the first hole 10a is formed by self-alignment. For this reason, an edge of the first hole 10a matches the outer surface of the transistor pillar 1.

Then, the insulating film 14, which covers the inner surface of the first hole 10a, is formed. Specifically, a silicon nitride film, which covers the entire surface of the inter-layer insulating film 10, is formed. Then, the silicon nitride film is etched. Thus, the insulating film 14 can be formed.

Then, the upper diffusion layer 9 is formed in the top portion of the transistor pillar 1. Specifically, an impurity, which has a conductive type that is opposite to the conductive type of the impurity contained in the silicon substrate 4, is ion-implanted into the top portion of the transistor pillar 1. The ion-implantation is carried out at an energy of 10 keV, at a dose amount of $1\times10^{14}/cm^2$. Then, a thermal treatment process is carried out at a temperature of 900° C., for approximately 10 seconds. Additionally, a silicon layer or a silicide layer may be formed on the upper diffusion layer 9.

Figure 8A:
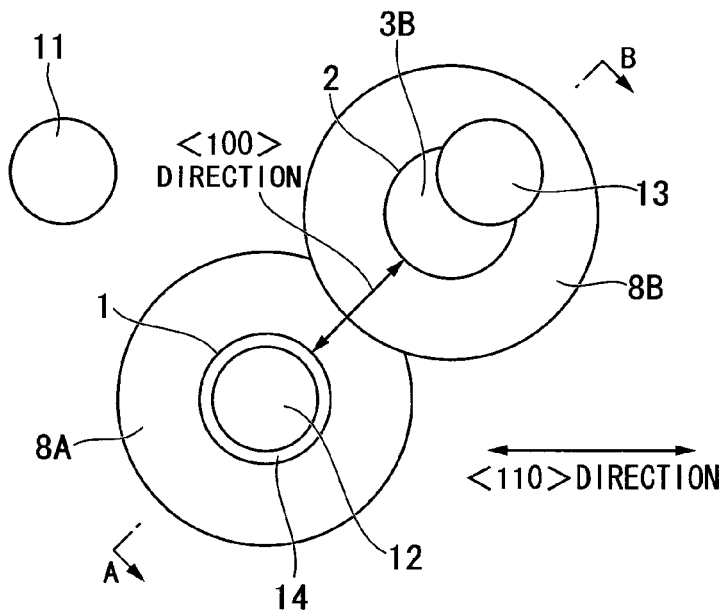
Figure 8B:
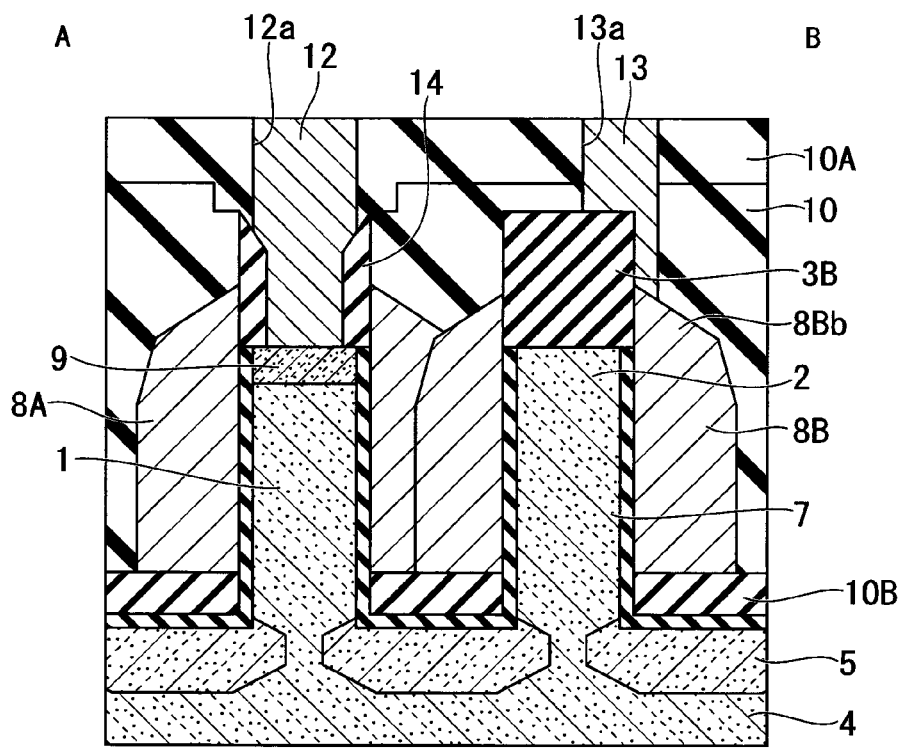

In a sixth process shown in FIGS. 8A and 8B, an inter-layer insulating film 10A is formed so as to fill the first hole 10a and to cover the inter-layer insulating film 10. The inter-layer insulating films 10 and 10A are made of the same material. Then, a second hole 12a is formed so as to partially expose the upper surface of the upper diffusion layer 9. Additionally, a third hole 13a is formed so as to partially expose an upper surface of the dummy gate electrode 8B. Further, a fourth hole (not shown) is formed so as to partially expose an upper surface of the lower diffusion layer 5. Then, the contacts 11 to 13 are formed. The contact 11 fills the fourth hole and is connected to the lower diffusion layer 5. The contact 12 fills the second hole 12a and is connected to the upper diffusion layer 9. The contact 13 fills the third hole 13a and is connected to the top portion 8Bb of the dummy gate electrode 8B. In the sixth process, the inter-layer insulating films 10 and 10A may be made of different materials.

Specifically, after the inter-layer insulating film 10A is formed over the inter-layer insulating film 10 shown in FIG. 7B, the second hole 12a, the third hole 13a, and the fourth hole (not shown) are formed. Then, a metal film is embedded in the second hole 12a, the third hole 13a, and the fourth hole to form the contact 12, the contact 13, and the contact 11, respectively.

The metal film may be a multi-layered film including a titanium film, a titanium nitride film, and a tungsten film with a composition ratio Ti/TiN/W of 5 nm/10 nm/50 nm. Then, the metal film is planarized. An illustration of the contact 11, which is connected to the lower diffusion layer 5, is omitted in FIG. 8B.

Figure 9A:
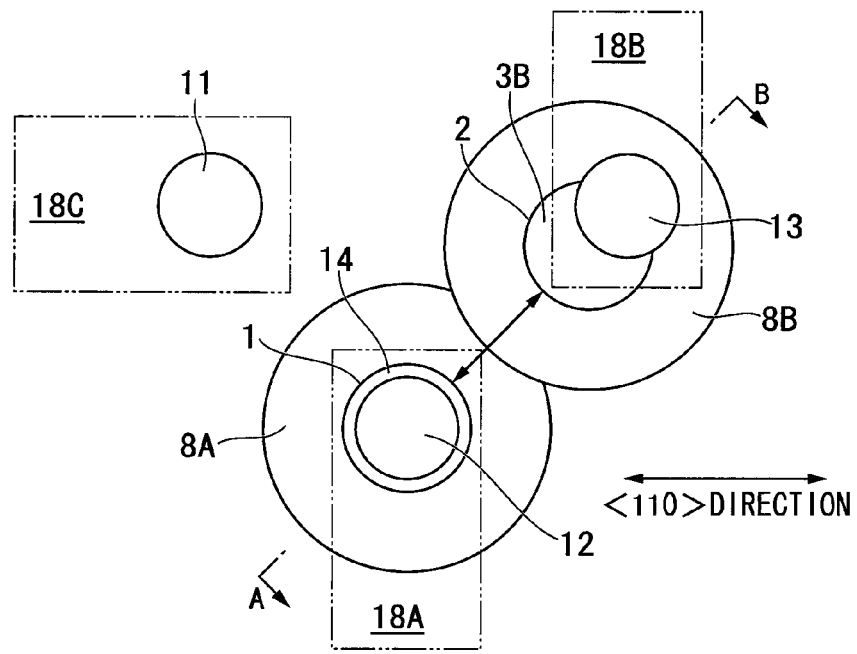
Figure 9B:
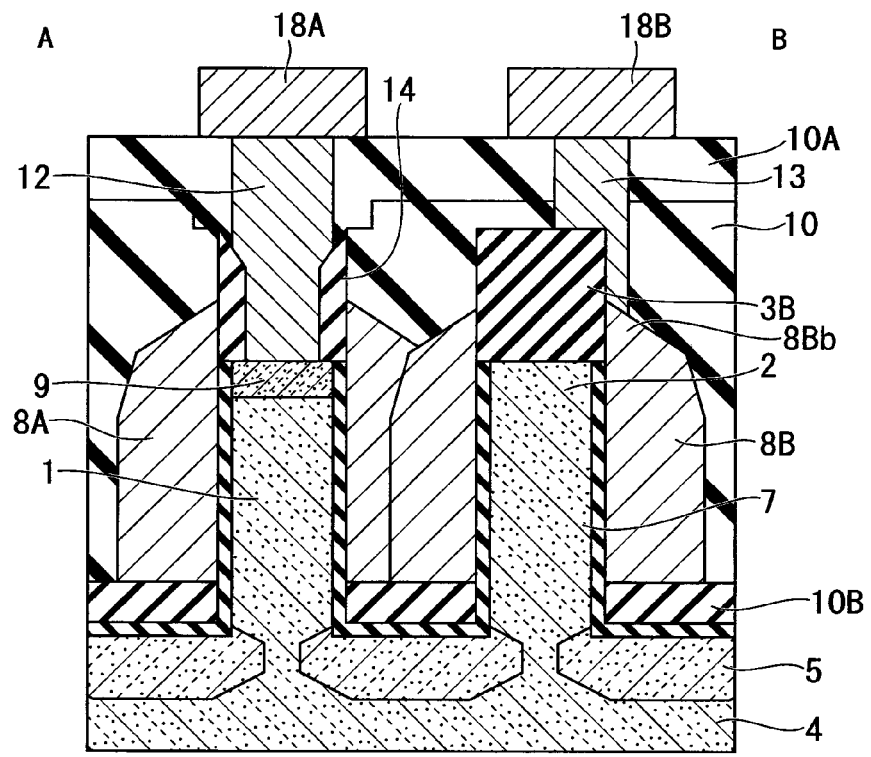

In a seventh process shown in FIGS. 9A and 9B, wires 18A, 18B, and 18C are formed so as to be connected to the contact 12, the contact 13, and the contact 11, respectively. The wires 18A, 18B, and 18C are made of, for example, a tungsten film having a thickness of 60 nm.

According to the pillar MOS transistor formed by the method of the first embodiment, the transistor pillar 1 and the dummy pillar 2 are aligned in the <100> direction. The (110) planes, the thermal oxidation rate of which is the maximum among crystal planes forming the side surfaces of the pillars 1 and 2, do not face each other in the <100> direction. For this reason, the thermal oxide films 6 covering the side surfaces of the transistor pillar 1 and the dummy pillar 2 do not become thicker than when the transistor pillar 1 and the dummy pillar 2 are aligned in the <110> direction.

When the thermal oxide film 6 is removed using a chemical solution, the (110) planes, the etching rate of which is the maximum among crystal planes forming the side surfaces of the pillars 1 and 2, do not face each other in the <100> direction. For this reason, the amount of the etched thermal oxide films 6 in the <100> direction is smaller than when the transistor pillar 1 and the dummy pillar 2 are aligned in the <110> direction.

Accordingly, the <100>-directed diameters of the transistor pillar 1 and the dummy pillar 2 are reduced by 10 nm or less from the original diameters thereof when the pillars 1 and 2 are formed. Specifically, the diameter of each pillar 1 and 2 is reduced by 5 nm on the facing side and by 5 nm on the opposing side. Consequently, after the pillar MOS transistor is complete, the <100>-directed diameters of the transistor pillar 1 and the dummy pillar 2 become 40 nm or more, which has been 50 nm when the pillars 1 and 2 have been formed. Further, the distance between the transistor pillar 1 and the dummy pillar 2 becomes 60 nm or less, which has been 50 nm when the pillars 1 and 2 have been formed. This is because the diameter of each pillar 1 and 2 on the facing side is reduced by 5 nm or less. In this case, thicknesses of the gate electrodes 8A and 8B may be set to 30 nm or more so that the gate electrodes 8A and 8B contact each other and are not separated from each other.

According to the method of the first embodiment, a variation in pillar diameter is smaller than when the transistor pillar 1 and the dummy pillar 2 are aligned in the <110> direction as in the related art. Accordingly, thicknesses of the gate electrodes 8A and 8B may be set to approximately 35 nm so that the gate electrodes 8A and 8B are certainly contact each other. This thickness is smaller by 10 nm than that of the gate electrodes of the related art, thereby decreasing the effect of stress caused by the thickness of the gate electrode.

Figure 10:
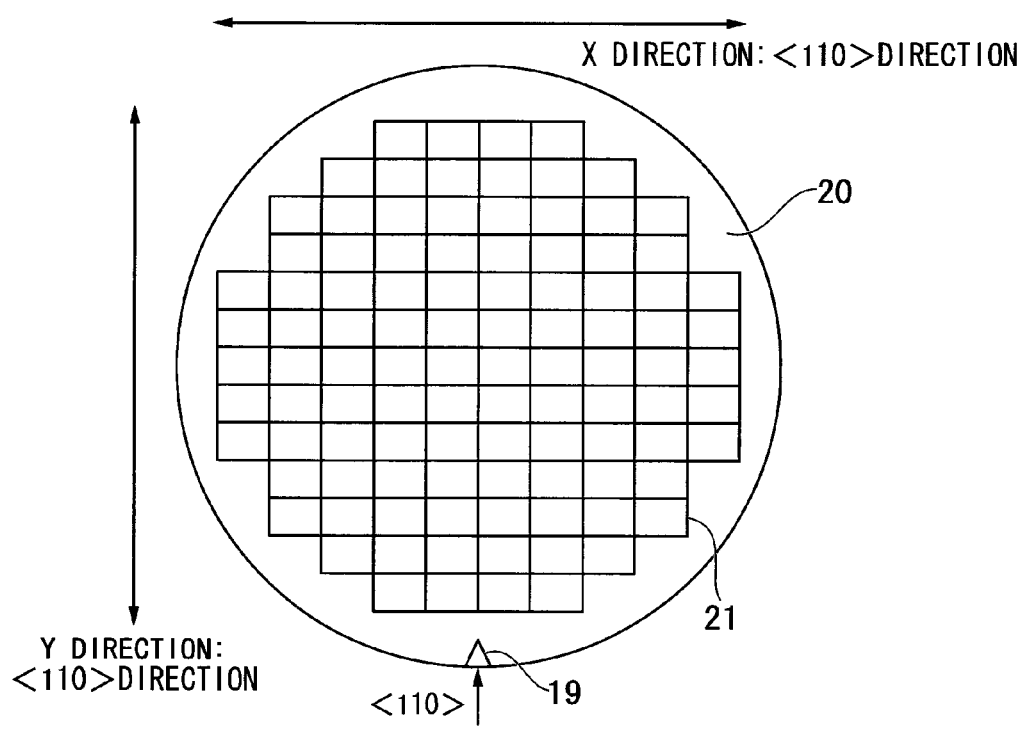
FIG. 10 is a plan view illustrating a main surface of a silicon substrate (wafer) forming the semiconductor device of the first embodiment.

FIG. 10 illustrates a silicon substrate (wafer) 20 having the (100) plane as a main surface, and a notch 19 indicating the <110> direction as a crystal orientation. In this case, the semiconductor chips 21 are diced in the <110> direction. Generally, the semiconductor chip 21 is packaged to be a complete product.

As shown in FIG. 10, multiple semiconductor chips 21 are formed on one silicon substrate 20 upon fabrication of the semiconductor device 21. The notch 19 is provided in the silicon substrate 20 so as to indicate the <110> direction. Accordingly, the X direction, which is parallel to the tangent to the notch 19, becomes the <110> direction. Additionally, the Y direction, which is perpendicular to the X direction, also becomes the <110> direction.

The rectangular semiconductor chips 21 are arranged such that each side of the semiconductor chips is parallel to the X or Y direction. An exposure apparatus exposes a rectangular mask pattern onto the silicon substrate 20 that is attached on the exposure apparatus. Thus, a pattern for forming a semiconductor device on the rectangular semiconductor chip 21 is transferred onto the silicon substrate 20.

Accordingly, if an extending direction of a wiring pattern is set to be parallel to one side of the mask, and if an arrangement direction of a transistor pillar pattern and a dummy pillar pattern is set to be inclined at 45 degrees to the extending direction of the wiring pattern, the wiring pattern extending in the X direction, i.e., the <110> direction, and the transistor pillar pattern and the dummy pillar pattern which are arranged in the <100> direction can be formed on the silicon substrate 20 by aligning, in the exposure apparatus, one side of the mask to the tangent to the notch, i.e., the X-direction before the exposure. As a matter of course, one side of the mask may be aligned to the Y direction before the exposure.

If the position relationship between the silicon substrate 20 and the mask is previously recorded in the exposure apparatus, multiple semiconductor chips 21 having the same position relationship can be formed on the silicon substrate 20. The <110> direction shown in FIGS. 1 to 9 matches the X or Y direction on the silicon substrate 20 shown in FIG. 10.

Figure 11:
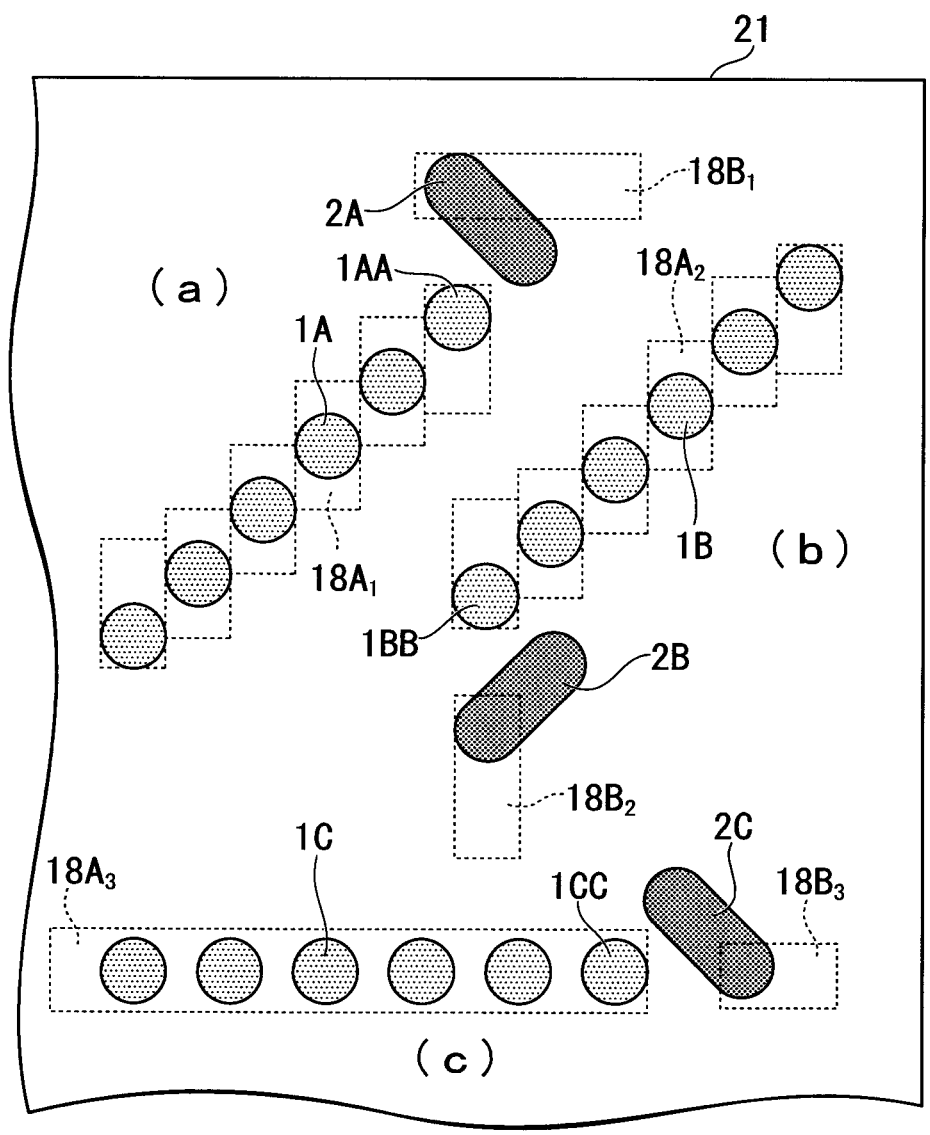
FIGS. 11 and 12 are plan views illustrating layout examples (a) to (f) of the transistor pillar, the dummy pillar, and the wire of the first embodiment.
Figure 12:
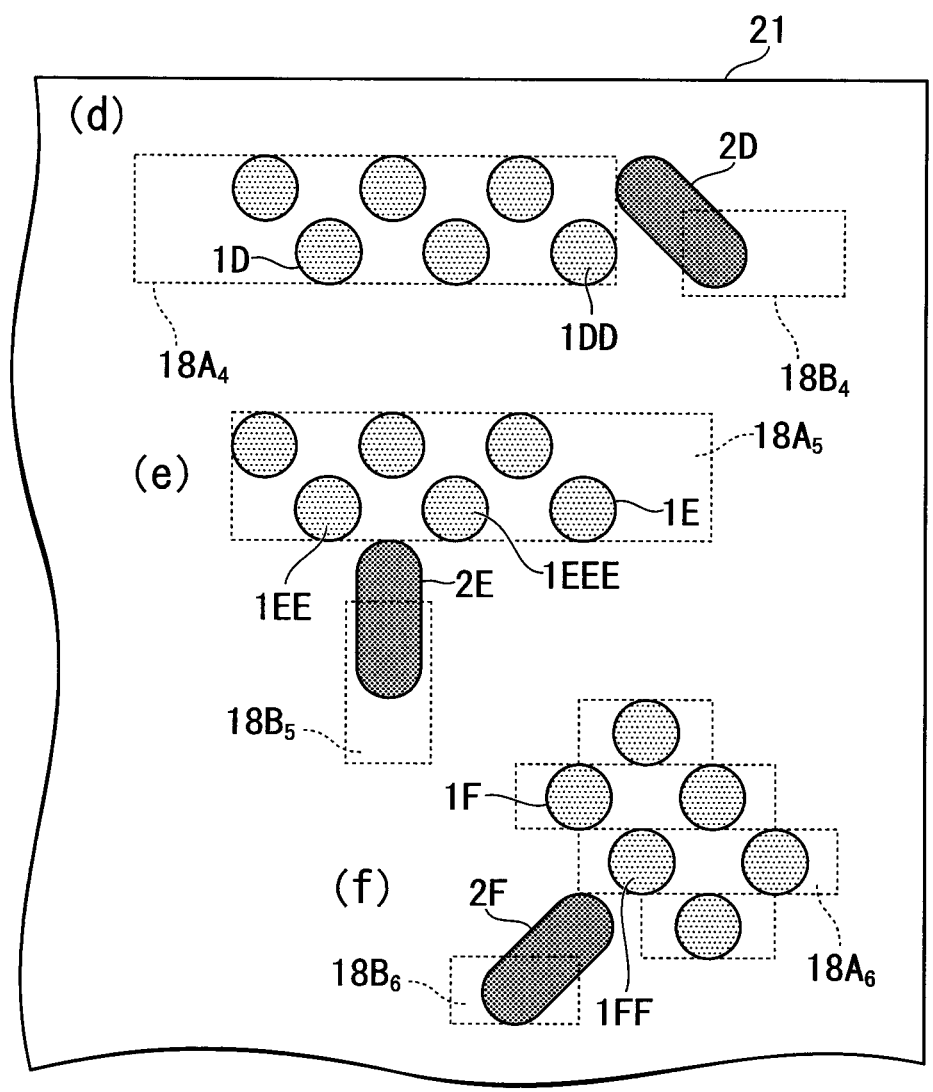
Figure 13:
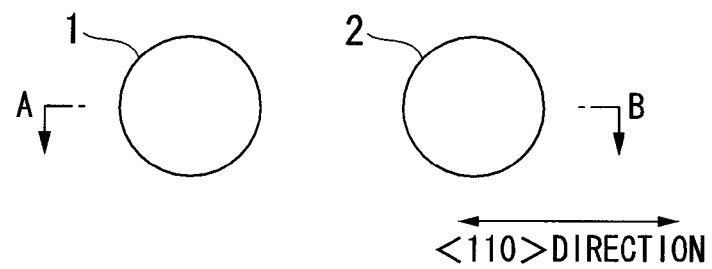
FIG. 13 is a plan view illustrating an arrangement of a transistor pillar and a dummy pillar which are included in a semiconductor device of a related art.
Figure 14:
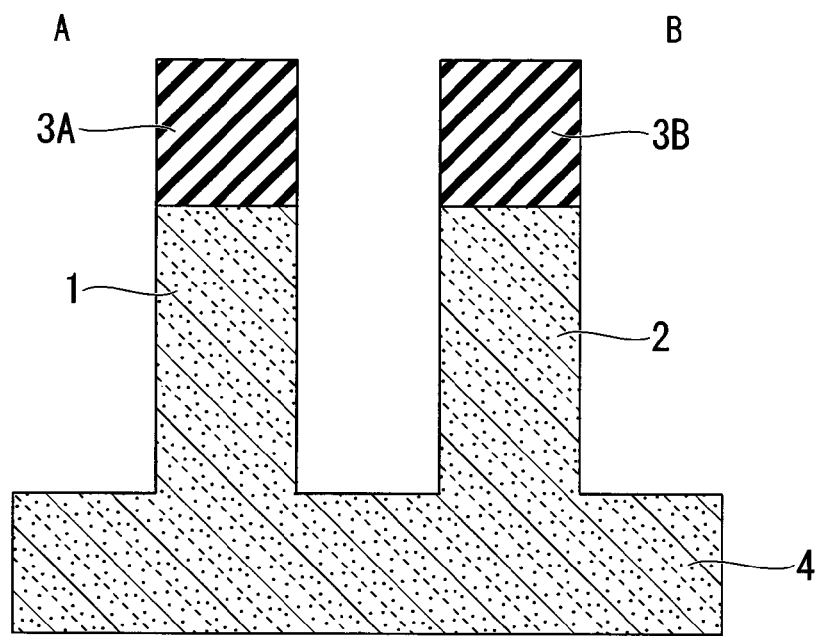
FIGS. 14 to 19 are cross-sectional views indicative of a process flow illustrating a method of manufacturing the semiconductor device of the related art.
Figure 15:
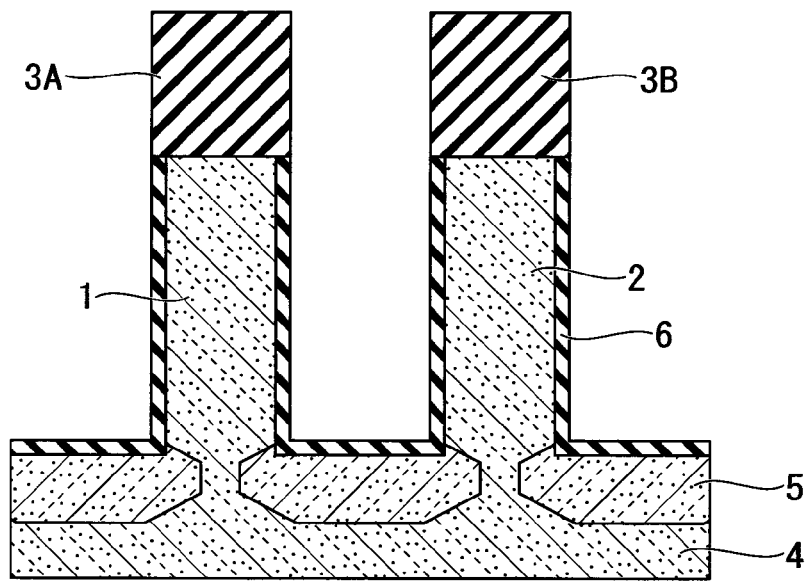
Figure 16:
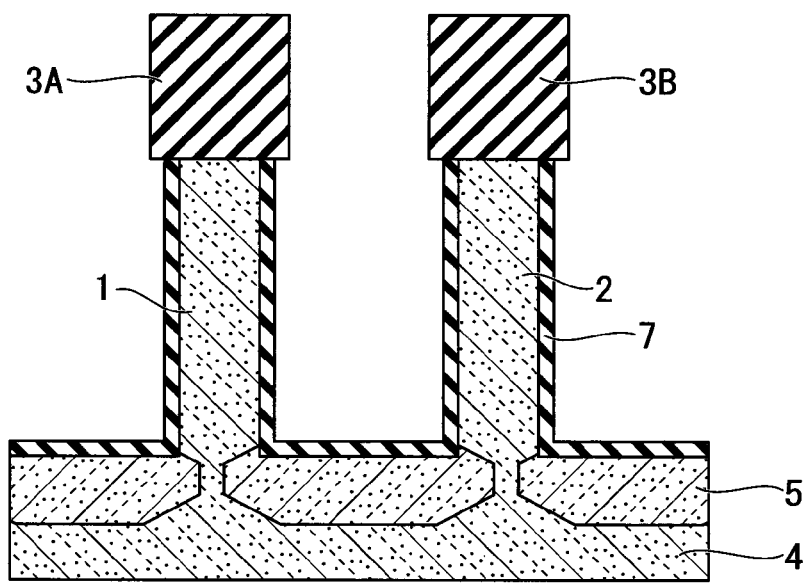
Figure 17:
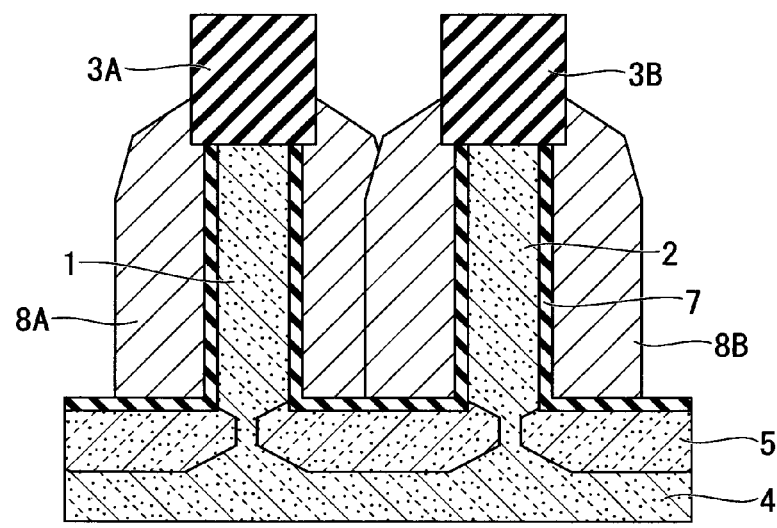
Figure 18:
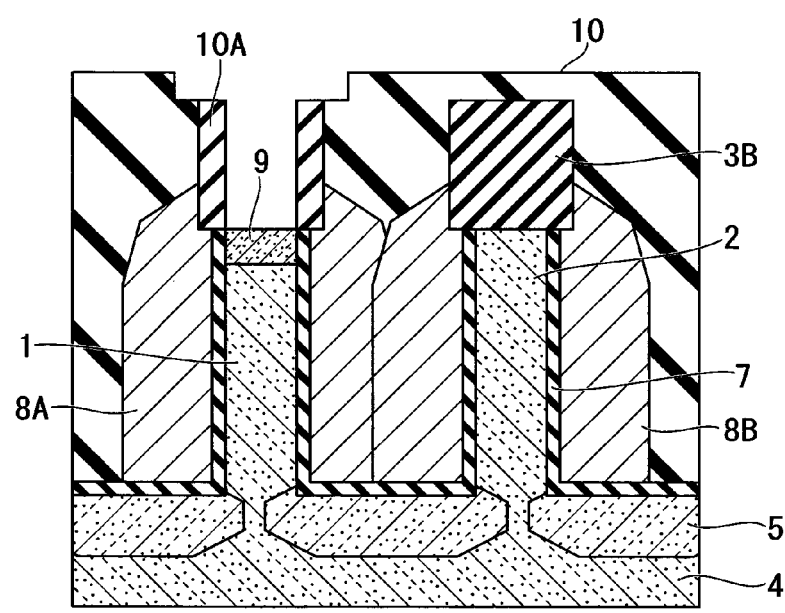
Figure 19:
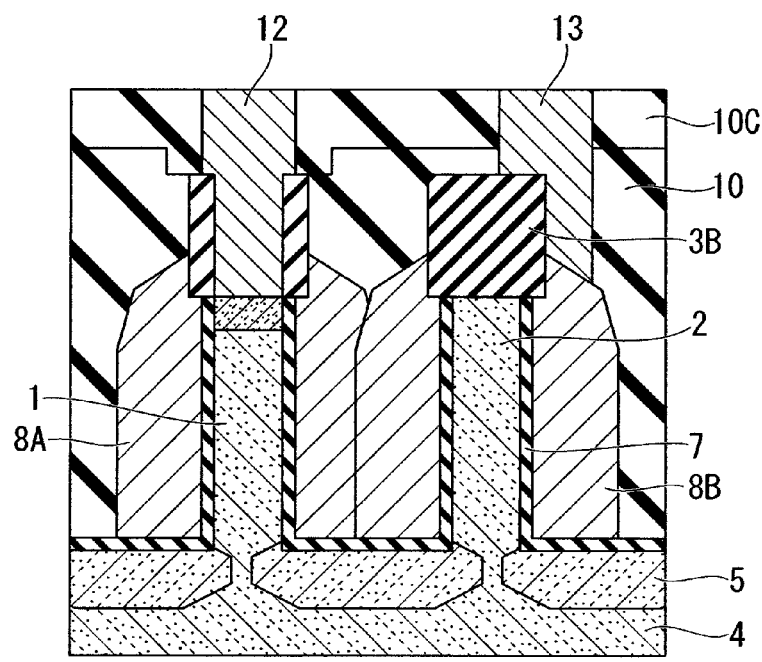
Figure 20:
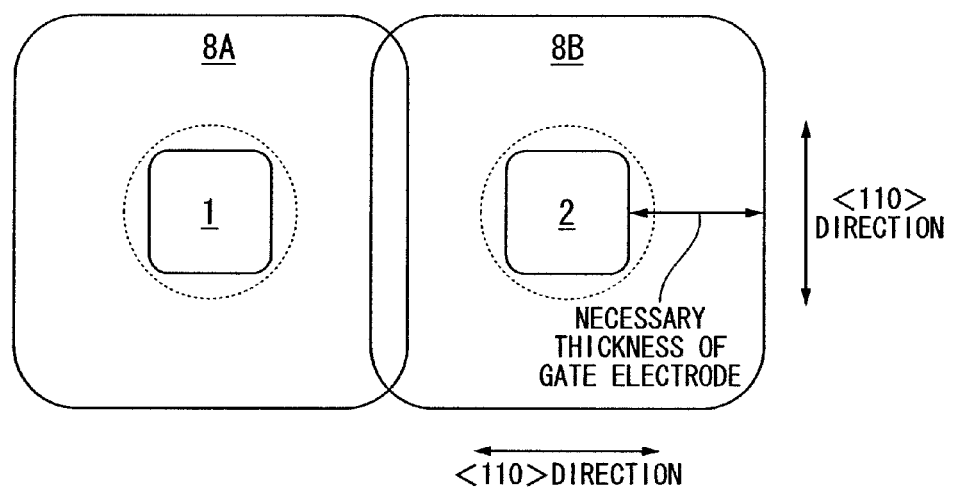
FIG. 20 is a plan view illustrating a pillar diameter and a pillar interval after a pillar MOS transistor is formed by a method of the related art for manufacturing a semiconductor device.

FIGS. 11 and 12 illustrate example arrangements of the transistor pillar 1 and the dummy pillar 2 included in the semiconductor chip 21. To emphasize the arrangement of the transistor pillar 1 and the dummy pillar 2, the wire 18 is denoted by a dashed line, and an illustration of contacts is omitted in FIGS. 11 and 12.

Similar to the first embodiment shown in FIGS. 2A and 2B, each of the dummy pillars 2A, 2B, 2C, 2D, 2E, and 2F shown in FIGS. 11 and 12 includes an extending source portion, an extending portion, and an extending end portion. The extending source portion and the transistor pillars 1 are aligned in the <100> direction. The extending portion extends from the extending source portion in a direction away from the transistor pillars 1.

FIG. 11 illustrates three layout examples (a), (b), and (c) of transistor pillars and wires, which are included in the semiconductor chip 21. The transistor pillars include transistor pillars 1A, 1B, and 1C, and dummy pillars 2A, 2B, and 2C. In each example, the six transistor pillars are aligned in a line and connected in parallel.

In the example (a), the six transistor pillars 1A are aligned in the <100> direction. A wire $18A_1$ is provided for each transistor pillar 1A and is connected to an upper diffusion layer of each transistor pillar 1A. Each wire $18A_1$ covers each transistor pillar 1A. The transistor pillar 1A nearest to the dummy pillar 2A is denoted as "1AA." The wire $18A_1$ extends in a first <110> direction. The extending source portion of the dummy pillar 2A and the six transistor pillars 1A (including the nearest transistor pillar 1AA) are aligned in the first <100> direction. The extending portion of the dummy pillar 2A extends in a second <100> direction perpendicular to the first <100> direction. A wire $18B_1$, which is connected to a dummy gate electrode of the dummy pillar 2A, extends from an extending end portion of the dummy pillar 2A in a second <110> direction perpendicular to the first <110> direction. The wire $18B_1$ covers the extending end portion of the dummy pillar 2A.

In the example (b), the six transistor pillars 1B are aligned in the same first <100> direction as in the example (a). The transistor pillar nearest to the dummy pillar 2B is denoted as "1BB." A wire $18A_2$ extends in the same first <110> direction as in the example (a). Each wire $18A_2$ covers each transistor pillar 1B. On the other hand, the extending source portion of the dummy pillar 2B and the nearest transistor pillar 1BB are aligned in the second <100> direction perpendicular to the first <100> direction. The extending portion of the dummy pillar 2B extends in the first <100> direction. A wire $18B_2$, which is connected to a dummy gate electrode of the dummy pillar 2B, extends from the extending end potion of the dummy gate pillar 2B in the first <110> direction. The wire $18B_2$ covers the extending end portion of the dummy pillar 2B.

In the example (c), six transistor pillars 1C are aligned in the same second <110> direction as in the example (a). The transistor pillar nearest to the dummy pillar 2C is denoted as "1CC." A wire $18A_3$, which is common to the six transistor pillar 1C, extends in the same second <110> direction. Each wire $18A_3$ covers each transistor pillar 1C. On the other hand, the extending source portion of the dummy pillar 2C and the transistor pillar 1CC are aligned in the same first <100> direction as in the example (a). The extending potion of the dummy pillar 2C extends in a direction parallel to the second <100> direction as in the example (a), but facing opposite to the second <100> direction. A wire $18B_3$, which is connected to a dummy gate electrode of the dummy pillar 2C, extends from the extending end portion of the dummy pillar 2C in the second <110> direction. The wire $18B_3$ covers the extending end portion of the dummy pillar 2C.

FIG. 12 illustrates other three layout examples (d), (e), and (f) of the transistor pillars and wires, which are included in the semiconductor chip 21. The transistor pillars include transistor pillars 1D, 1E, and 1F, and dummy pillars 2D, 2E, and 2F. In each example, two sets of three transistor pillars are aligned in two lines and connected in parallel.

In the example (d), the two sets of the three transistor pillars 1D are aligned in a third <110> direction perpendicular to the <110> direction indicated by the notch shown in FIG. 10. The transistor pillar nearest to the dummy pillar 2D is denoted as "1DD." A wire $18A_4$, which is common to the six transistor pillars 1D, extends in the same third <110> direction. The wire $18A_4$ covers the six transistor pillars 1D. The extending source portion of the dummy pillar 2D and the transistor pillar 1DD are aligned in a third <100> direction. The dummy pillar 2D extends in a fourth <100> direction perpendicular to the third <100> direction. A wire $18B_4$, which is connected to a dummy gate electrode of the dummy pillar 2D, extends from the extending end potion of the dummy pillar 2D in the third <110> direction. The wire $18B_4$ covers the extending end portion of the dummy pillar 2D.

In the example (e), the two sets of the three transistor pillars 1E are aligned in the same third <110> direction as in the example (d). The transistor pillars nearest to the dummy pillar 2E are denoted as "1EE" and "1EEE," which are equally separated from the dummy pillar 2E. A wire $18A_5$, which is common to the six transistor pillars 1E, extends in the same third <110> direction. The wire $18A_5$ covers the six transistor pillars 1E. On the other hand, the extending source portion of the dummy pillar 2E and the transistor pillar 1EE are aligned in a fifth <100> direction perpendicular to the same third <100> direction as in the example (d). The extending source portion of the dummy pillar 2E and the transistor pillar 1EEE are aligned in a sixth <100> direction perpendicular to the fifth <100> direction. The extending portion of the dummy pillar 2E and a wire $18B_5$ extend in a sixth <110> direction perpendicular to the third <110> direction. The wire $18B_5$ covers the extending end portion of the dummy pillar 2E.

In the example (f), the two sets of the three transistor pillars 1F are aligned in a sixth <100> direction. The transistor pillar nearest to the dummy pillar 2F is denoted as "1FF." Four wires $18A_6$, which are connected to upper diffusion layers of the six transistor pillars 1F, extend in the same third <110> direction as in the examples (d) and (e). Two of the four wires $18A_6$ are common to the upper diffusion layers of two sets of two transistor pillars 1F. The extending source portion of the dummy pillar 2F and the transistor pillar 1FF are aligned in a seventh <100> direction perpendicular to the sixth <100> direction. The extending portion of the dummy pillar 2F extends in the seventh <100> direction. A wire $18B_6$ extends from the extending source potion of the dummy pillar 2F in the third <110> direction. The wire $18B_6$ covers the extending end portion of the dummy pillar 2F.

As explained above, according to the present invention, the dummy pillar has the extending portion that extends in a desired direction. Additionally, the gate contact is connected to the upper portion of the extending end portion of the dummy pillar. Accordingly, a wire can be lead out from the extending end portion of the dummy pillar, thereby increasing the flexibility of wire directions.

The present invention is applicable to semiconductor device manufacturing industries.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention, should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

In addition, while not specifically claimed in the claim section, the application reserves the right to include in the claim section at any appropriate time the following method.

A method of manufacturing a semiconductor device may include, but is not limited to the following processes. A first insulating film is formed over a semiconductor substrate. The first insulating film is patterned. The semiconductor substrate is partially removed using the first insulating film as a mask to form first and second portions aligned in a <100> direction. The first and second portions extend upwardly. The first and second portions are parts of the semiconductor substrate.

What is claimed is:

1. A semiconductor structure comprising:
   a semiconductor substrate;
   a first semiconductor structure extending upwardly over the semiconductor substrate; and
   a second semiconductor structure extending upwardly over the semiconductor substrate, the first and second semiconductor structures being aligned in a first <100> direction,
   wherein the first semiconductor structure comprises first to third portions, the first portion being nearest to the second semiconductor structure, the first portion and the second semiconductor structures being aligned in the first <100> direction, the second portion extending horizontally from the first portion to the third portion in a second <100> direction perpendicular to the first <100> direction.

2. The semiconductor structure according to claim 1, further comprising:
   a first wire covering the third portion; and
   a second wire covering the second semiconductor structure.

3. The semiconductor structure according to claim 2, wherein
   the first wire extends in a first <110> direction, and
   the second wire extends in a second <110> direction perpendicular to the first <110> direction.

4. The semiconductor structure according to claim 3, further comprising:
   a third semiconductor structure extending upwardly over the semiconductor substrate, the second and third semiconductor structures and the first portion being aligned in the first <100> direction, the second semiconductor structure being positioned between the third semiconductor structure and the first portion.

5. The semiconductor structure according to claim 4, further comprising:
   a third wire covering the third semiconductor structure, the third wire extending in the second <110> direction.

6. The semiconductor structure according to claim 2, wherein the first and second wires extend in a first <110> direction.

7. The semiconductor structure according to claim 6, further comprising:
   a third semiconductor structure extending upwardly over the semiconductor substrate, the second and third semiconductor structures being aligned in the second <100> direction.

8. The semiconductor structure according to claim 7, further comprising:
   a third wire covering the third semiconductor structure, the third wire extending in the first <110> direction in plan view.

9. The semiconductor structure according to claim 6, further comprising:
   a third semiconductor structure extending upwardly over the semiconductor substrate, the second and third semiconductor structures and the third portion being aligned in the first <110> direction.

10. The semiconductor structure according to claim 9, wherein the second wire covering the second and third semiconductor structures.

11. The semiconductor structure according to claim 2, further comprising:
    a first insulating film covering at least a side surface of the first semiconductor structure;
    a second insulating film covering at least a side surface of the second semiconductor structure;
    a third insulating film covering an upper surface of the first semiconductor structure;
    a gate electrode covering at least the first and second insulating films;
    a first contact extending upwardly, the first contact partially contacting the gate electrode and the third insulating film, and the first contact being connected to the first wire; and
    a second contact extending upwardly from the second semiconductor structure, the second contact being connected to the second wire.

12. A semiconductor device comprising:
    a semiconductor substrate;
    a first semiconductor structure extending upwardly over the semiconductor substrate; and
    a second semiconductor structure extending upwardly over the semiconductor substrate, the second semiconductor structure comprising first to third portions, the first portion being the nearest to the first semiconductor structure, the first portion and the first semiconductor structures being aligned in a first <100> direction, the second portion extending horizontally from the first portion to the third portion in a second <100> direction perpendicular to the first <100> direction.

13. The semiconductor device according to claim 12, further comprising:
    a first wire covering the first semiconductor structure, the first wire extends in a first <110> direction; and
    a second wire covering the third portion, the second wire extends in a second <110> direction perpendicular to the first <110> direction.

14. The semiconductor device according to claim 12, further comprising:
    a first wire covering the first semiconductor structure; and
    a second wire covering the third portion, the first and second wires extending in a first <110> direction.

15. The semiconductor device according to claim 13, further comprising:
    a third semiconductor device extending upwardly over the semiconductor substrate, the first and third semiconductor devices being aligned in the first <100> direction.

16. The semiconductor device according to claim 14, further comprising:
    a third semiconductor device extending upwardly over the semiconductor substrate, the first and third semiconductor devices being aligned in the second <100> direction.

17. The semiconductor device according to claim 15, further comprising:
    a third semiconductor device extending upwardly over the semiconductor substrate, the first and third semiconductor devices being aligned in the first <110> direction.

18. A semiconductor device comprising:
    a semiconductor substrate;
    a first semiconductor structure extending upwardly over the semiconductor substrate;

a second semiconductor structure extending upwardly over the semiconductor substrate, the first and second semiconductor structures being aligned in a first <110> direction; and a third semiconductor structure extending upwardly over the semiconductor substrate, the third semiconductor structure comprising first to third portions, the first and second semiconductor structures being equally separated from the first portion, the first portion and the first semiconductor structure being aligned in a first <100> direction, the first portion and the second semiconductor structure being aligned in a second <100> direction perpendicular to the first <100> direction, the second portion horizontally extending from the first portion to the third portion in a second <110> direction perpendicular to the first <110> direction.

19. The semiconductor device according to claim 18, wherein a first wire covering the first and second semiconductor structures, the first wire extending in the first <110> direction; and a second wire covering the third portion, the second wire extending in the second <110> direction.

* * * * *